(12) United States Patent
Chapple-Sokol et al.

(10) Patent No.: US 8,003,536 B2
(45) Date of Patent: Aug. 23, 2011

(54) ELECTROMIGRATION RESISTANT ALUMINUM-BASED METAL INTERCONNECT STRUCTURE

(75) Inventors: Jonathan D. Chapple-Sokol, Essex Junction, VT (US); Daniel A. Delibac, Colchester, VT (US); Zhong-Xiang He, Essex Junction, VT (US); Tom C. Lee, Essex Junction, VT (US); William J. Murphy, North Ferrisburgh, VT (US); Timothy D. Sullivan, Underhill, VT (US); David C. Thomas, Richmond, VT (US); Daniel S. Vanslette, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 12/552,641

(22) Filed: Sep. 2, 2009

(65) Prior Publication Data
US 2010/0237503 A1   Sep. 23, 2010

Related U.S. Application Data

(60) Provisional application No. 61/161,105, filed on Mar. 18, 2009.

(51) Int. Cl.
*H01L 21/44* (2006.01)
*H01L 21/4763* (2006.01)

(52) U.S. Cl. ........ 438/688; 438/648; 438/656; 438/685; 438/622; 257/E21.591; 257/E23.145

(58) Field of Classification Search .......... 438/688, 438/648, 656, 685, 622; 257/765, 767, E21.591, 257/E23.145
See application file for complete search history.

(56) References Cited

U.S. PATENT DOCUMENTS

| | | | |
|---|---|---|---|
| 4,154,874 A * | 5/1979 | Howard et al. ........... 216/13 |
| 4,673,623 A * | 6/1987 | Gardner et al. ........... 428/620 |
| 5,589,712 A * | 12/1996 | Kawashima et al. ....... 257/750 |
| 5,700,718 A * | 12/1997 | McTeer ..................... 438/642 |
| 5,854,140 A | 12/1998 | Jaso et al. |
| 5,877,087 A | 3/1999 | Mosely et al. |
| 5,990,011 A | 11/1999 | McTeer |
| 6,040,613 A | 3/2000 | McTeer et al. |
| 6,069,072 A * | 5/2000 | Konecni et al. ........... 438/642 |
| 6,080,665 A | 6/2000 | Chen et al. |
| 6,194,308 B1 | 2/2001 | McTeer et al. |
| 6,448,173 B1 | 9/2002 | Clevenger et al. |
| 6,617,689 B1 * | 9/2003 | Honeycutt ................. 257/750 |
| 6,690,077 B1 | 2/2004 | McTeer et al. |
| 6,833,623 B2 | 12/2004 | Leiphart |
| 6,969,448 B1 | 11/2005 | Lau |
| 2009/0032958 A1 * | 2/2009 | Farrar ....................... 257/771 |

* cited by examiner

*Primary Examiner* — Nitin Parekh
(74) *Attorney, Agent, or Firm* — Scully, Scott, Murphy & Presser, P.C.; Anthony J. Canale

(57) ABSTRACT

A vertical metallic stack, from bottom to top, of an elemental metal liner, a metal nitride liner, a Ti liner, an aluminum portion, and a metal nitride cap, is formed on an underlying metal interconnect structure. The vertical metallic stack is annealed at an elevated temperature to induce formation of a $TiAl_3$ liner by reaction of the Ti liner with the material of the aluminum portion. The material of the $TiAl_3$ liner is resistant to electromigration, thereby providing enhanced electromigration resistance to the vertical metallic stack comprising the elemental metal liner, the metal nitride liner, the $TiAl_3$ liner, the aluminum portion, and the metal nitride cap. The effect of enhanced electromigration resistance may be more prominent in areas in which the metal nitride cap suffers from erosion during processing.

7 Claims, 6 Drawing Sheets

ELECTROMIGRATION RESISTANT ALUMINUM-BASED METAL INTERCONNECT STRUCTURE

FIELD OF THE INVENTION

The present invention relates to a metal interconnect structure, and particularly to an aluminum-based electromigration resistant metal interconnect structure, and methods of manufacturing the same.

BACKGROUND

A metal line comprises a lattice of metal ions and non-localized free electrons. The metal ions are formed from metal atoms that donate some of their electrons to a common conduction band of the lattice, and the non-localized free electrons move with relatively small resistance within the lattice under an electric field. Normal metal lines, excluding superconducting materials at or below a superconducting temperature, have finite conductivity, which is caused by interaction of electrons with crystalline imperfections and phonons which are thermally induced lattice vibrations.

When electrical current flows in the metal line, the metal ions are subjected to an electrostatic force due to the charge of the metal ion and the electric field to which the metal ion is exposed to. Further, as electrons scatter off the lattice during conduction of electrical current, the electrons transfer momentum to the metal ions in the lattice of the conductor material. The direction of the electrostatic force is in the direction of the electric field, i.e., in the direction of the current, and the direction of the force due to the momentum transfer of the electrons is in the direction of the flow of the electrons, i.e., in the opposite direction of the current. However, the force due to the momentum transfer of the electrons is generally greater than the electrostatic force. Thus, metal ions are subjected to a net force in the opposite direction of the current, or in the direction of the flow of the electrons.

High defect density, i.e., smaller grain size of the metal, or high temperature typically increases electron scattering, and consequently, the amount of momentum transfer from the electrons to the conductor material. Such momentum transfer, if performed sufficiently cumulatively, may cause the metal ions to dislodge from the lattice and move physically. The mass transport caused by the electrical current, or the movement of the conductive material due to electrical current, is termed electromigration in the art.

In applications where high direct current densities are used, such as in metal interconnects of semiconductor devices, electromigration causes a void in a metal line or in a metal via. Such a void results in a locally increased resistance in the metal interconnect, or even an outright circuit "open." In this case, the metal line or the metal via no longer provides a conductive path in the metal interconnect. Formation of voids in the metal line or the metal via can thus result in a product failure in semiconductor devices.

In prior art aluminum-based metal-interconnect structures that are employed as a wiring structure to pass electrical current, electromigration failures have been empirically observed around the interface between a Ti liner portion and an aluminum layer. Further, it has been observed that loss of material occurs at corners of a Ti cap portion overlying the aluminum layer in a low pattern density area. Such a loss in the material of the Ti cap portion exacerbates the electromigration failure in the prior art aluminum-based metal interconnect structures.

In view of the above, there exists a need for an aluminum-based metal interconnect structure that provides a higher electromigration resistance than prior art aluminum-based metal interconnect structures, and methods of manufacturing the same.

SUMMARY

The present invention provides an aluminum-based metal interconnect structure including a vertical stack of an elemental metal liner, a metal nitride liner, a $TiAl_3$ liner, an aluminum portion, and a metal nitride cap portion having enhanced electromigration resistance, and methods of manufacturing the same.

In the present invention, a vertical metallic stack comprising, from bottom to top, an elemental metal liner, a metal nitride liner, a Ti liner, an aluminum portion, and a metal nitride cap, is formed on an underlying metal interconnect structure. The vertical metallic stack is annealed at an elevated temperature to induce formation of a $TiAl_3$ liner by reaction of the Ti liner with the material of the aluminum portion. The material of the $TiAl_3$ liner is resistant to electromigration, thereby providing enhanced electromigration resistance to the vertical metallic stack comprising the elemental metal liner, the metal nitride liner, the $TiAl_3$ liner, the aluminum portion, and the metal nitride cap. The effect of enhanced electromigration resistance may be more prominent in areas in which the metal nitride cap suffers from erosion during processing.

According to an aspect of the present invention, a metal interconnect structure is provided, which comprises:

an elemental metal liner portion abutting a top surface of a dielectric material layer;

a metal nitride liner portion abutting a top surface of the elemental metal liner portion;

a $TiAl_3$ liner portion abutting a top surface of the metal nitride liner portion;

an aluminum portion abutting a top surface of the $TiAl_3$ liner portion; and a metal nitride cap portion abutting a top surface of the aluminum portion.

In one embodiment, the elemental metal liner portion, the metal nitride liner portion, the $TiAl_3$ liner portion, and the aluminum portion have substantially vertically coincident sidewalls.

In another embodiment, the metal interconnect structure further comprises a conductive structure abutting a bottom surface of the elemental metal liner portion and embedded in the dielectric material layer.

In yet another embodiment, the metal interconnect structure further comprises an overlying dielectric material layer which overlies the metal nitride cap and has an opening in which a top surface of the metal nitride cap portion is exposed.

In still another embodiment, the elemental metal liner portion consists essentially of Ti or Ta, and wherein the metal nitride liner portion consists essentially of TiN or TaN, and wherein the metal nitride cap portion consists essentially of TiN or TaN.

According to another aspect of the present invention, another metal interconnect structure is provided, which comprises:

an elemental metal liner portion abutting a top surface of a dielectric material layer;

a metal nitride liner portion abutting a top surface of the elemental metal liner portion;

a Ti liner portion abutting a top surface of the metal nitride liner portion;

an aluminum portion abutting a top surface of the Ti liner portion; and a metal nitride cap portion abutting a top surface of the aluminum portion.

In one embodiment, the elemental metal liner portion, the metal nitride liner portion, the Ti liner portion, and the aluminum portion have substantially vertically coincident sidewalls.

In another embodiment, the metal interconnect structure further comprises a conductive structure abutting a bottom surface of the elemental metal liner portion and embedded in the dielectric material layer.

In yet another embodiment, the elemental metal liner portion consists essentially of Ti or Ta, and wherein the metal nitride liner portion consists essentially of TiN or TaN, and wherein the metal nitride cap portion consists essentially of TiN or TaN.

According to yet another aspect of the present invention, a method of forming a metal interconnect structure is provided, which comprises:

forming an elemental metal liner layer directly on a top surface of a dielectric material layer;

forming a metal nitride liner layer directly on a top surface of the elemental metal liner layer;

forming a Ti liner layer directly on a top surface of the metal nitride liner layer;

forming an aluminum layer directly on a top surface of the Ti liner layer;

forming a metal nitride cap layer directly on a top surface of the aluminum portion;

patterning the aluminum layer to from an aluminum portion and patterning the Ti liner layer to form a Ti liner portion; and annealing the Ti liner portion and the aluminum portion, wherein the Ti liner portion reacts with a sub-portion of the aluminum layer portion to form a $TiAl_3$ liner abutting the metal nitride liner portion and a remaining sub-portion of the aluminum layer portion.

In one embodiment, the method further comprises forming a conductive structure in the dielectric material layer, wherein a top surface of the conductive structure is substantially coplanar with a top surface of the dielectric material layer.

In another embodiment, the method further comprises:

applying a photosensitive material on the metal nitride cap layer;

lithographically patterning the photosensitive material; and transferring a pattern in the photosensitive material into the metal nitride cap layer, the aluminum layer, the Ti liner, the metal nitride liner, and the elemental metal liner, wherein a metal nitride cap portion, the aluminum portion, the Ti liner portion, a metal nitride liner portion, and an elemental metal liner portion are formed.

In yet another embodiment, the method further comprises:

forming an overlying dielectric material layer which overlies the metal nitride cap; and forming an opening in the overlying dielectric material layer, wherein a top surface of the metal nitride cap is exposed in the opening.

In still another embodiment, the elemental metal liner consists essentially of Ti or Ta, and wherein the metal nitride liner consists essentially of TiN or TaN, and wherein the metal nitride cap layer consists essentially of TiN or TaN.

DETAILED DESCRIPTION

Figure 1:
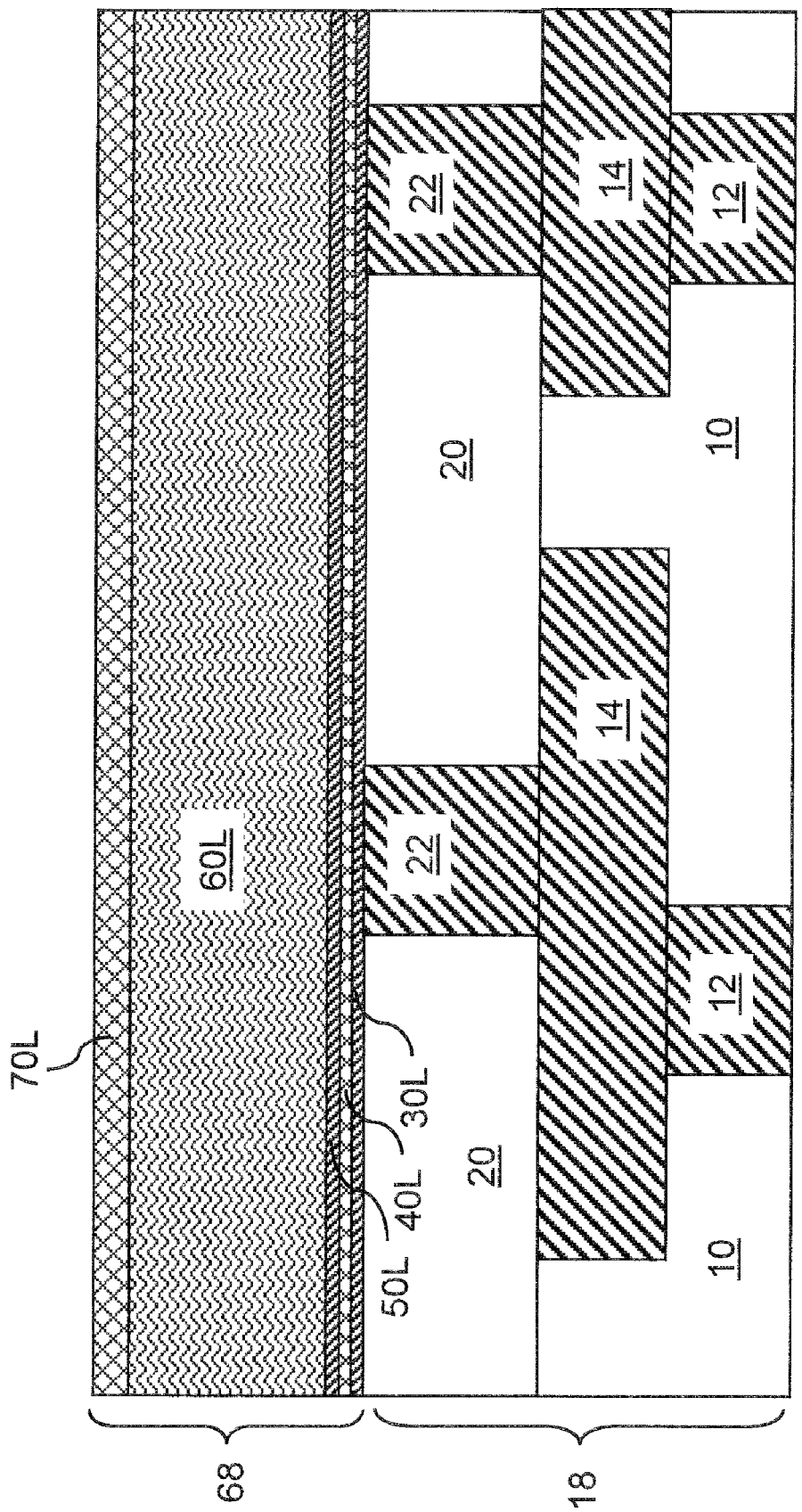
FIGS. 1-3 show sequential vertical cross-sectional views of a first exemplary aluminum-based metal interconnect structure at various stages of a manufacturing process according to a first embodiment of the present invention.

As stated above, the present invention relates to electromigration resistant metal interconnect structures including a metal line and a conductive via, which are described herein with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

As used herein, a structural element is referred to as being "on" another structural element when the structural element is located directly on the other structural element or when a set of at least one intervening element making direct physical contact with the structural element and the other structural element is present. A structural element is referred to as being "directly on" another structural element when there is no intervening structural element and a physical contact is formed between the structural element and the other structural element. An element "abuts" another element when a physical interface area providing a direct contact is present between the element and the other element.

Referring to FIG. 1, a first exemplary metal interconnect structure according to a first embodiment of the present invention comprises a copper-based metal interconnect region 18 and an aluminum-based metal interconnect region 68. The underlying metal interconnect region 18 comprises a first dielectric material layer 10 and a second dielectric material layer 20. The first dielectric material layer 10 embeds at least one first underlying metal via 12 and at least one underlying metal line 14. The second dielectric material layer 20 embeds at least one second underlying metal via 22.

Each of the first dielectric material layer 10 and the second dielectric material layer 20 may comprise an oxide based conventional dielectric material, which has a dielectric constant k from about 3.6 to about 3.9, or a low-k dielectric material, which has a dielectric constant k of about 3.0 or less, preferably less than about 2.8, and more preferably less than about 2.5. Non-limiting examples of the oxide based conventional dielectric material included undoped silicate glass (USG), fluorosilicate glass (FSG), borophosphosilicate glass (BPSG), and phosphosilicate glass (PSG).

The low-k dielectric material may be a spin-on low-k dielectric material or a CVD low-k dielectric material, i.e., a low-k dielectric material deposited by chemical vapor deposition (CVD). An example of the spin-on low-k dielectric material is a thermosetting polyarylene ether, which is also commonly referred to as "Silicon Low-K", or "SiLK™." The term "polyarylene" herein denotes aryl moieties or inertly substituted aryl moieties which are linked together by bonds, fused rings, or inert linking groups such as oxygen, sulfur, sulfone, sulfoxide, carbonyl, etc. Composition and deposition methods of the CVD low-k dielectric material are well known in the art. For example, the CVD low-k dielectric material may be a SiCOH dielectric containing a matrix of a hydrogenated oxidized silicon carbon material (SiCOH) comprising atoms of Si, C, O and H in a covalently bonded tri-dimensional network.

Both the spin-on low-k dielectric material and the CVD low-k dielectric material may be porous, which decreases the dielectric constant of the first dielectric material layer 10 and/or the second dielectric material layer 20. Each of the first dielectric material layer 10 and the second dielectric material layer 20 may comprise a stack of at least two of the oxide based conventional dielectric material, the spin-on low-k dielectric material, and the CVD low-k dielectric material.

The thickness of the first dielectric material layer 10 and the thickness of the second dielectric material layer 20 may be from 50 nm to about 2 μm, and typically from 100 to about 500 nm, although lesser and greater thicknesses are explicitly contemplated herein.

The first dielectric material layer 10 the second dielectric material layer 20 may include an optional dielectric cap layer (not shown). The optional dielectric cap layer typically comprises a non-porous dielectric material such as silicon nitride, silicon oxynitride, BLoK™ which is a low-k material containing Si, C, O, and H and formed by plasma enhanced chemical vapor deposition and provided, for example, by Applied Materials Inc.™, or NBLoK™ which is a low-k material containing Si, C, O, H, and N and formed by plasma enhanced chemical vapor deposition and provided, for example, by Applied Materials Inc.™ The optional dielectric cap layer, if present, protects the underlying conductive structures (12, 14, 22) from in-diffusion of impurities as well as enhancement of electromigration resistance of the underlying conductive structures (12, 14, 22). The thickness of the optional dielectric cap layer may be from about 3 nm to about 90 nm, and typically from about 6 nm to about 40 nm.

The at least one first underlying metal via 12 is formed in a lower portion of the first dielectric material layer 10, and the at least one underlying metal line 14 is formed in an upper portion of the first dielectric material layer 10. The at least one first underlying metal via 12 and the at least one underlying metal line 14 may comprise any metallic material including Cu, Al, W, etc. The first dielectric material layer 10 embedding the at least one first underlying metal via 12 and the at least one underlying metal line 14 exemplifies one of general metal interconnect structures. For the purposes of the present invention, any metal interconnect structure may be employed in lieu of the first dielectric material layer 10 embedding the at least one first underlying metal via 12 and the at least one underlying metal line 14.

The at least one second underlying metal via 22 is formed in the second dielectric material layer 20 by formation of a via cavity in the second dielectric material layer 20, followed by filling of the via cavity with a underlying material and planarization, which renders the top surface of the at least one second underlying metal via 22 substantially coplanar with a top surface of the second dielectric material layer 20. The at least one second underlying metal via 22 may comprise any metallic material including Cu, Al, W, etc. The at least one second underlying metal via 22 extends from a top surface of the second dielectric material layer 20 to a top surface of the at least one underlying metal line 14.

An elemental metal liner layer 30L is deposited directly on the planar top surfaces of the at least one second underlying metal via 22 and the second dielectric material layer 20. The elemental metal liner layer 30L may comprise elemental Ta or elemental Ti. Preferably, the elemental metal liner layer 30L consists essentially of Ta or Ti. The thickness of the elemental metal liner layer 30L may be from about 3 nm to about 30 nm, although lesser and greater thicknesses are also contemplated herein. The elemental metal liner layer 30L may be formed by physical vapor deposition (PVD), chemical vapor deposition (CVD), atomic layer deposition (ALD), etc. The resistivity of the elemental metal liner layer 30L varies with the composition. The resistivity of Ta may be from about 13 μΩ-cm or greater depending on the method of deposition and the grain structure of the film. The resistivity of Ti may be from about 42 μΩ-cm or greater depending on the method of deposition and the grain structure of the film.

A metal nitride liner layer 40L is deposited directly on the planar top surface of the elemental metal liner layer 30L. The metal nitride liner layer 40L may comprise TaN or TiN. Preferably, the elemental metal liner consists essentially of Ta or Ti. The thickness of the metal nitride liner layer 40L may be from about 3 nm to about 60 nm, although lesser and greater thicknesses are also contemplated herein. The metal nitride liner layer 40L may be formed by physical vapor deposition (PVD), chemical vapor deposition (CVD), atomic layer deposition (ALD), etc. The resistivity of the metal nitride liner layer 40L varies with the composition. The resistivity of TaN may be from about 200 μΩ-cm or greater depending on the method of deposition and the grain structure of the film. The resistivity of TiN may be from about 31 μΩ-cm or greater depending on the method of deposition and the grain structure of the film.

A Ti liner layer 50L is deposited directly on the planar top surfaces of the metal nitride liner layer 40L. The Ti liner layer 50L comprises elemental Ti. Preferably, the Ti liner layer 50L consists essentially of elemental Ti. The thickness of the Ti liner layer 50L may be from about 3 nm to about 30 nm, although lesser and greater thicknesses are also contemplated herein. The Ti liner layer 50L may be formed by physical vapor deposition (PVD), chemical vapor deposition (CVD), atomic layer deposition (ALD), etc.

An aluminum layer 60L is deposited on the planar top surfaces of the Ti liner layer 50L. The aluminum layer 60L comprises elemental aluminum. The aluminum layer 60L may further comprise a small amount of other metals such as Cu at an atomic concentration of 1% or less to improve electromigration resistance. The aluminum layer 60L consists essentially of aluminum. The thickness of the aluminum layer 60L may be from about 300 nm to about 3,000 nm, although lesser and greater thicknesses are also contemplated herein. The aluminum layer 60L may be formed by physical vapor deposition (PVD). The resistivity of the aluminum layer 60L may be from about 2.7 μΩ-cm or greater depending on the method of deposition and the grain structure of the film.

A metal nitride cap layer 70L is deposited directly on the planar top surface of the aluminum layer 60L. The metal nitride cap layer 70L may comprise TaN or TiN. Preferably, the metal nitride cap layer 70L consists essentially of TaN or TiN. The thickness of the metal nitride cap layer 70L may be from about 20 nm to about 200 nm, although lesser and greater thicknesses are also contemplated herein. The metal nitride cap layer 70L may be formed by physical vapor deposition (PVD), chemical vapor deposition (CVD), atomic layer deposition (ALD), etc.

The elemental metal liner layer 30L, the metal nitride liner layer 40L, the Ti liner layer 50L, the aluminum layer 60L, and the metal nitride cap layer 70L collectively constitute the aluminum-based metal interconnect region 68.

Figure 2:
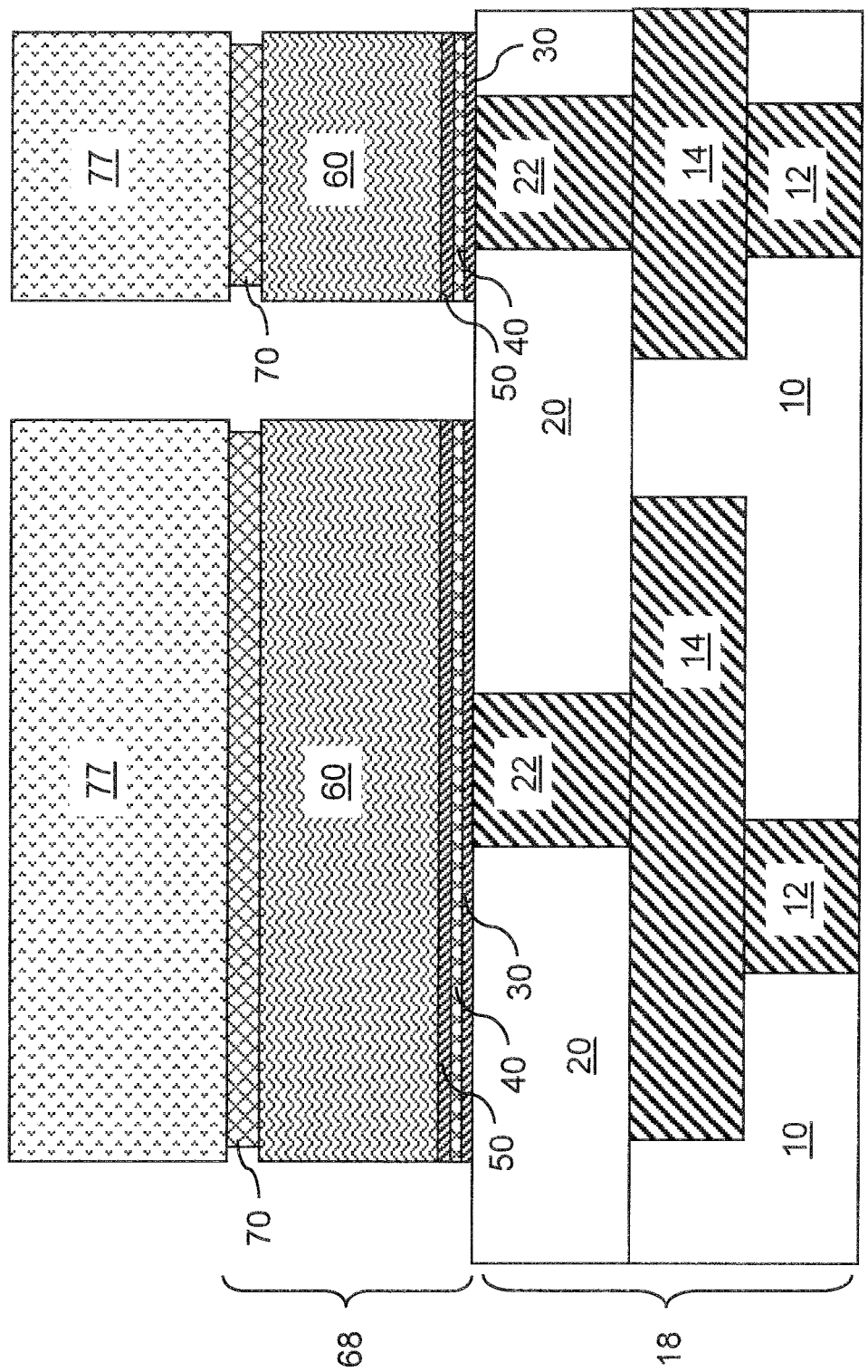

Referring to FIG. 2, a photosensitive material 77 is applied over the top surface of the metal nitride cap layer 70L and lithographically patterned. The photosensitive material 77 may be a photoresist or may be a photosensitive polyimide (PSPI). The pattern in the photosensitive material 77 is transferred into the material stack of the aluminum-based metal interconnect region 68, i.e., into the metal nitride cap layer 70L, the aluminum layer 60L, the Ti liner layer 50L, the metal nitride liner layer 40L, and the elemental metal liner layer 30L. The remaining portions of the metal nitride cap layer 70L, the aluminum layer 60L, the Ti liner layer 50L, the metal nitride liner layer 40L, and the elemental metal liner layer 30L constitute at least one metal nitride cap portion 70, at least one aluminum portion 60, at least one Ti liner portion 50, at least one metal nitride liner portion 40, and at least one elemental metal liner portion 30, respectively.

An etch is employed to transfer the pattern of the photosensitive material 77 into the material stack of the aluminum-based metal interconnect region 68. The etch may be an anisotropic etch, or an isotropic etch. Preferably, the etch is an anisotropic etch. Preferably, the etch is selective to the material of the second dielectric material layer 20. If the etch is an anisotropic etch, within each vertical stack of an elemental metal liner portion 30, a metal nitride liner portion 40, a Ti liner portion 50, an aluminum portion 60, a metal nitride cap portion 70, the sidewalls of the metal nitride liner portion 40, the Ti liner portion 50, the aluminum portion 60, the metal nitride cap portion 70 are substantially vertically coincident. The sidewall of the metal nitride cap portion 70 that overlies the aluminum portion 60 may be vertically coincident with the sidewalls of the aluminum portion 60, or may be laterally recessed inward due to erosion during the etch. The photosensitive material 77 is subsequently removed.

Figure 3:
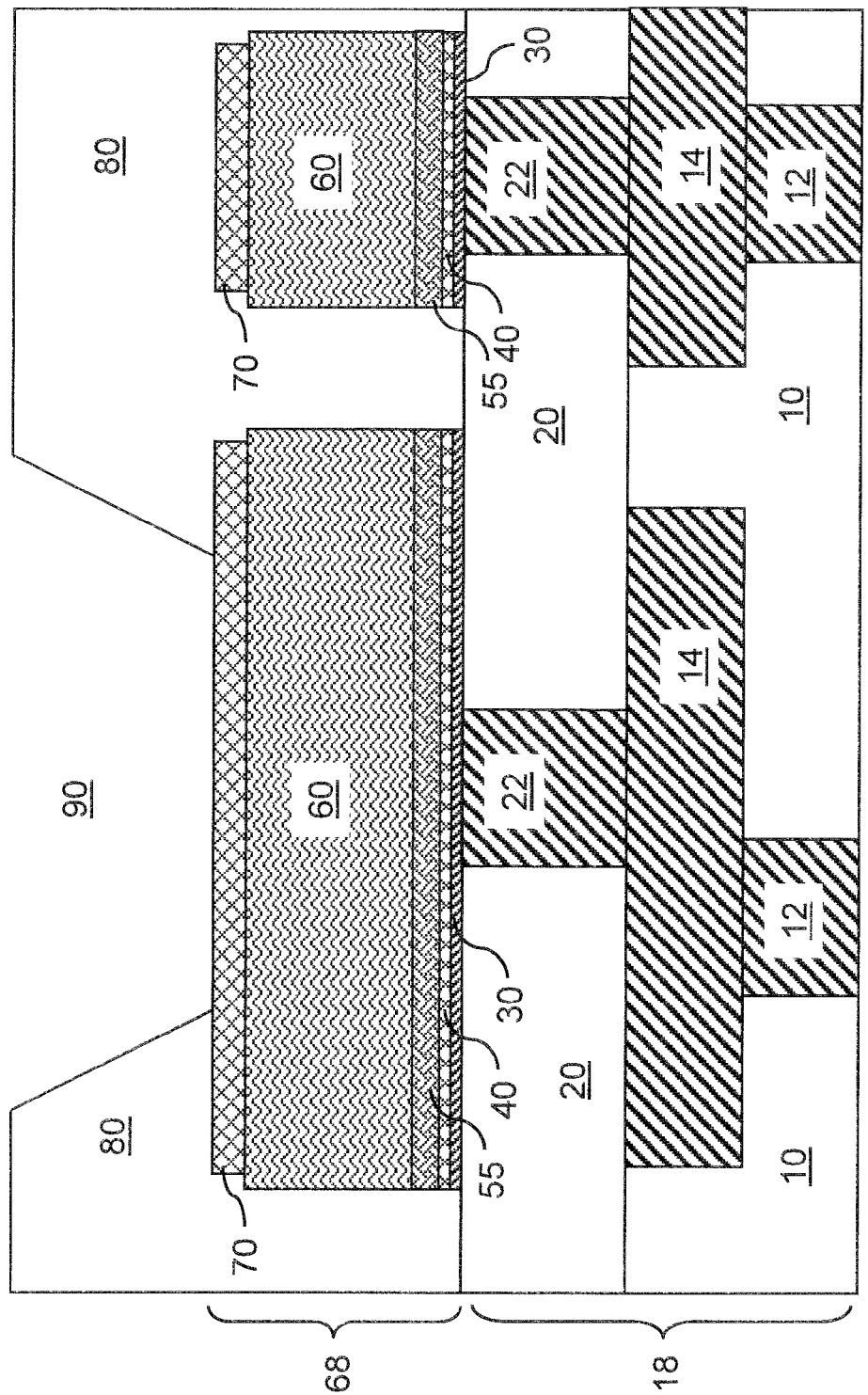

Referring to FIG. 3, the first exemplary metal interconnect structure is annealed at an elevated temperature from about 250° C. to about 500° C., and typically from about 350° C. to about 450° C. to induce reaction between the Ti liner portion 50 and a lower sub-portion of the aluminum portion 60. The duration of the anneal depends on the thickness of the Ti liner portion 50, and may be from about 1 minute to about 600 minutes, and is typically from about 5 minutes to about 120 minutes. For example, the anneal may be performed at about 400° C. for about 20 minutes.

During the anneal, the Ti liner portion 50 and the lower sub-portion of the aluminum portion 60 react to form a $TiAl_3$ liner portion 55 which comprises the intermetallic compound of $TiAl_3$. The entirety of the Ti material in the Ti liner portion 50 is consumed to form the $TiAl_3$ liner portion 55. The ratio of the thickness of the $TiAl_3$ liner portion 55 after the anneal to the thickness of the Ti liner portion 50 prior to the anneal is about 3.1. The thickness of the $TiAl_3$ liner portion 55 may be from about 10 nm to about 90 nm, and typically from about 15 nm to about 45 nm, although lesser and greater thicknesses are also contemplated herein. The thickness of the aluminum portion 60 may be from about 300 nm to about 3,000 nm, although lesser and greater thicknesses are also contemplated herein.

An overlying dielectric material layer 80 may be formed over the at least one vertical stack (30, 40, 55, 60, 70). A via opening 90 having a tapered sidewall may be formed directly above the top surface of the at least one the metal nitride cap portion 70. The overlying dielectric material layer 80 may comprise the same dielectric material as the first and second dielectric material layers (10, 20). In this case, an additional metallization structure including an aluminum-containing conductive structure, e.g., a structure having the same material stack as the at least one vertical stack (30, 40, 55, 60, 70), may be formed directly on the top surface of the metal nitride liner portion 70. Alternately, the overlying dielectric material layer 80 may comprise photosensitive polyimide (PSPI).

Each of the at least one vertical stack (30, 40, 55, 60, 70) constitutes an aluminum-based metal-interconnect structure that may be employed as a wiring structure and pass current. The $TiAl_3$ liner portion 55 enhances electromigration resistance of the aluminum-based metal-interconnect structure because the $TiAl_3$ is electromigration resistant, and provides a supplementary conductive path having a higher resistivity than the at least one aluminum portion 60. Thus, the first exemplary metal interconnect structure provides an enhanced electromigration resistance than a comparable prior art structure that does not include any $TiAl_3$ liner portion.

Figure 4:
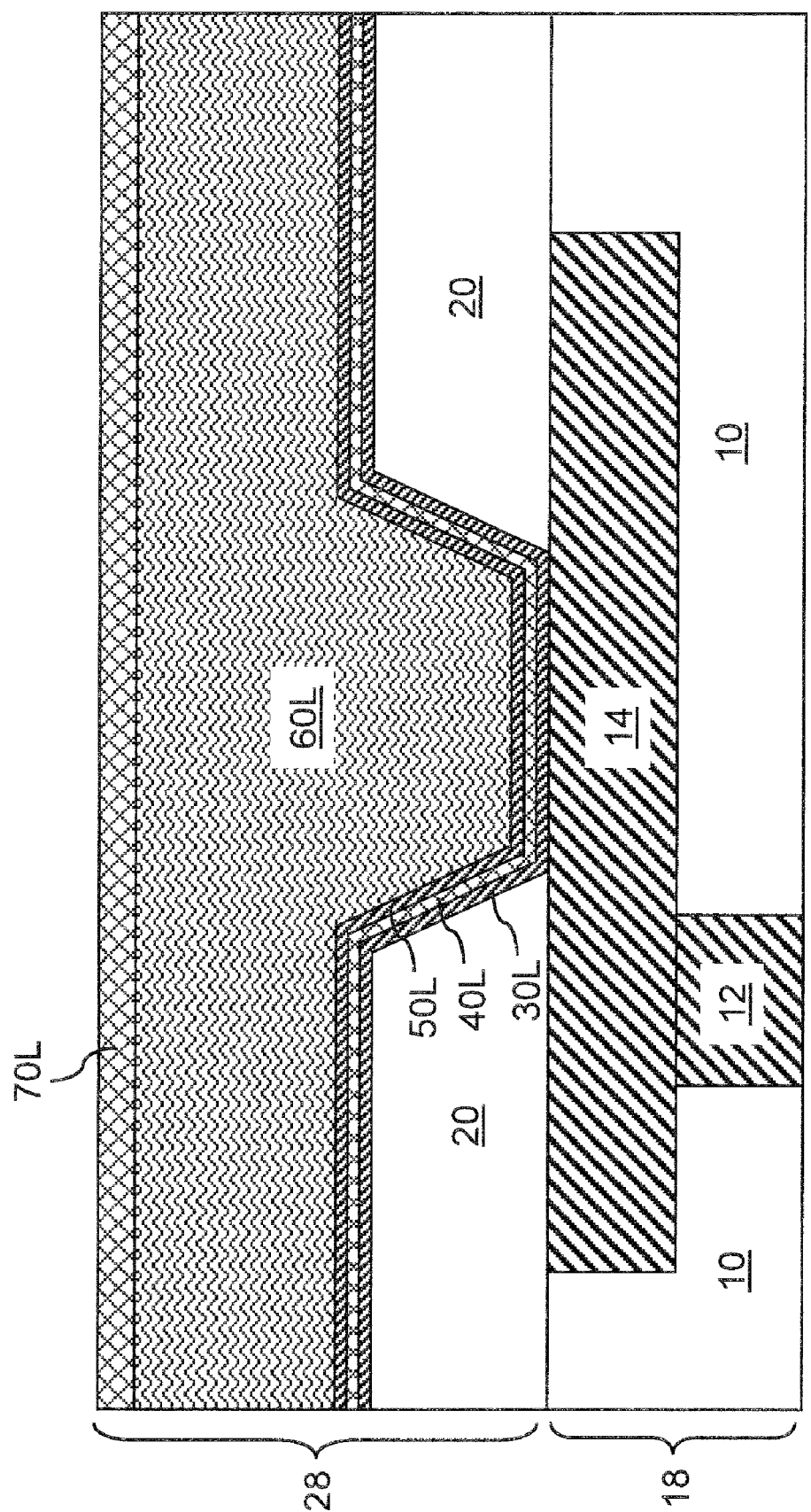
FIGS. 4-6 show sequential vertical cross-sectional views of a second exemplary aluminum-based metal interconnect structure at various stages of a manufacturing process according to a second embodiment of the present invention.

Referring to FIG. 4, a second exemplary metal interconnect structure according to a second embodiment of the present invention comprises a copper-based metal interconnect region 18 and an aluminum-based metal interconnect region 28. The underlying metal interconnect region 18 comprises a first dielectric material layer 10. The first dielectric material layer 10 embeds at least one first underlying metal via 12 and at least one underlying metal line 14. The first dielectric material layer 10, the at least one first underlying metal via 12, and the at least one underlying metal line 14 may be the same as in the first embodiment. The at least one first underlying metal via 12 and the at least one underlying metal line 14 are conductive structures.

The aluminum-based metal interconnect region comprises a second dielectric material layer 20, an elemental metal liner layer 30L, a metal nitride liner 40L, a Ti liner layer 50L, an aluminum layer 60L, and a metal nitride cap layer 70L. The composition and thickness of the second dielectric material layer 20 may be the same as in the first embodiment. The second dielectric material layer 20 includes a tapered via opening, which is filled with the conductive materials of the elemental metal liner layer 30L, the metal nitride liner layer 40L, the Ti liner layer 50L, and the aluminum layer 60L. Thus, the second dielectric material layer 20 embeds a via portion of the conductive materials of the elemental metal liner layer 30L, the metal nitride liner layer 40L, the Ti liner layer 50L, and the aluminum layer 60L.

The second dielectric material layer 20 vertically abuts a first top surface portion of the at least one underlying metal line 14. A first sub-portion of the elemental metal liner layer 30L vertically abuts a second top surface portion of the at least one underlying metal line 14. A second sub-portion of the elemental metal liner layer 30L vertically abuts a top surface of the second dielectric material layer. The top surface of the at least one underlying metal line 14 is substantially coplanar with a top surface of the first dielectric material layer 10. The via portion of the conductive materials of the elemental metal liner layer 30L, the metal nitride liner 40L, the Ti liner layer 50L, and the aluminum layer 60L extends from a top surface of the second dielectric material layer 20 to a top surface of the at least one underlying metal line 14.

Each of the elemental metal liner layer 30L, the metal nitride liner layer 40L, the Ti liner layer 50L, the aluminum layer 60L, and the metal nitride cap layer 70L may have the same composition and thickness as in the first embodiment. Each of the elemental metal liner layer 30L, the metal nitride liner layer 40L, the Ti liner layer 50L, the aluminum layer 60L, and the metal nitride cap layer 70L may be formed employing the same methods as in the first embodiment.

Figure 5:
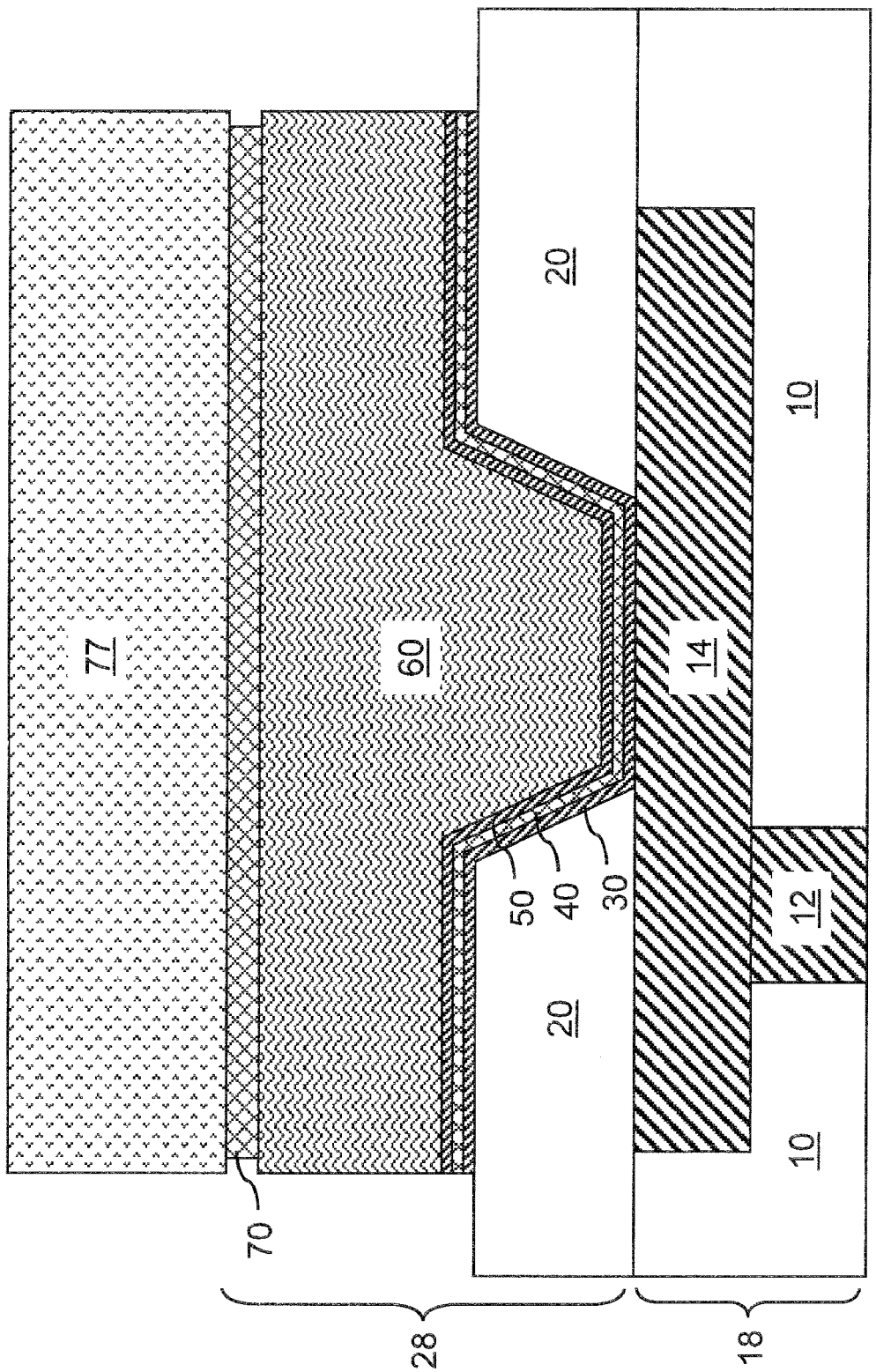

Referring to FIG. 5, a photosensitive material 77 is applied over the top surface of the metal nitride cap layer 70L and lithographically patterned. The photosensitive material 77 may be a photoresist or may be a photosensitive polyimide (PSPI). The pattern in the photosensitive material 77 is transferred into the material stack of the aluminum-based metal interconnect region 28, i.e., into the metal nitride cap layer 70L, the aluminum layer 60L, the Ti liner layer 50L, the metal nitride liner layer 40L, and the elemental metal liner layer 30L. The remaining portions of the metal nitride cap layer 70L, the aluminum layer 60L, the Ti liner layer 50L, the metal nitride liner layer 40L, and the elemental metal liner layer 30L constitute at least one metal nitride cap portion 70, at least one aluminum portion 60, at least one Ti liner portion 50, at least one metal nitride liner portion 40, and at least one elemental metal nitride portion 30, respectively. The remaining portions of the patterned materials include the via portion that contacts the top surface of the at least one underlying metal line 14. The patterning of the metal nitride cap layer 70L, the aluminum layer 60L, the Ti liner layer 50L, the metal nitride liner layer 40L, and the elemental metal liner layer 30L may be performed employing the same methods as in the first embodiment.

Figure 6:
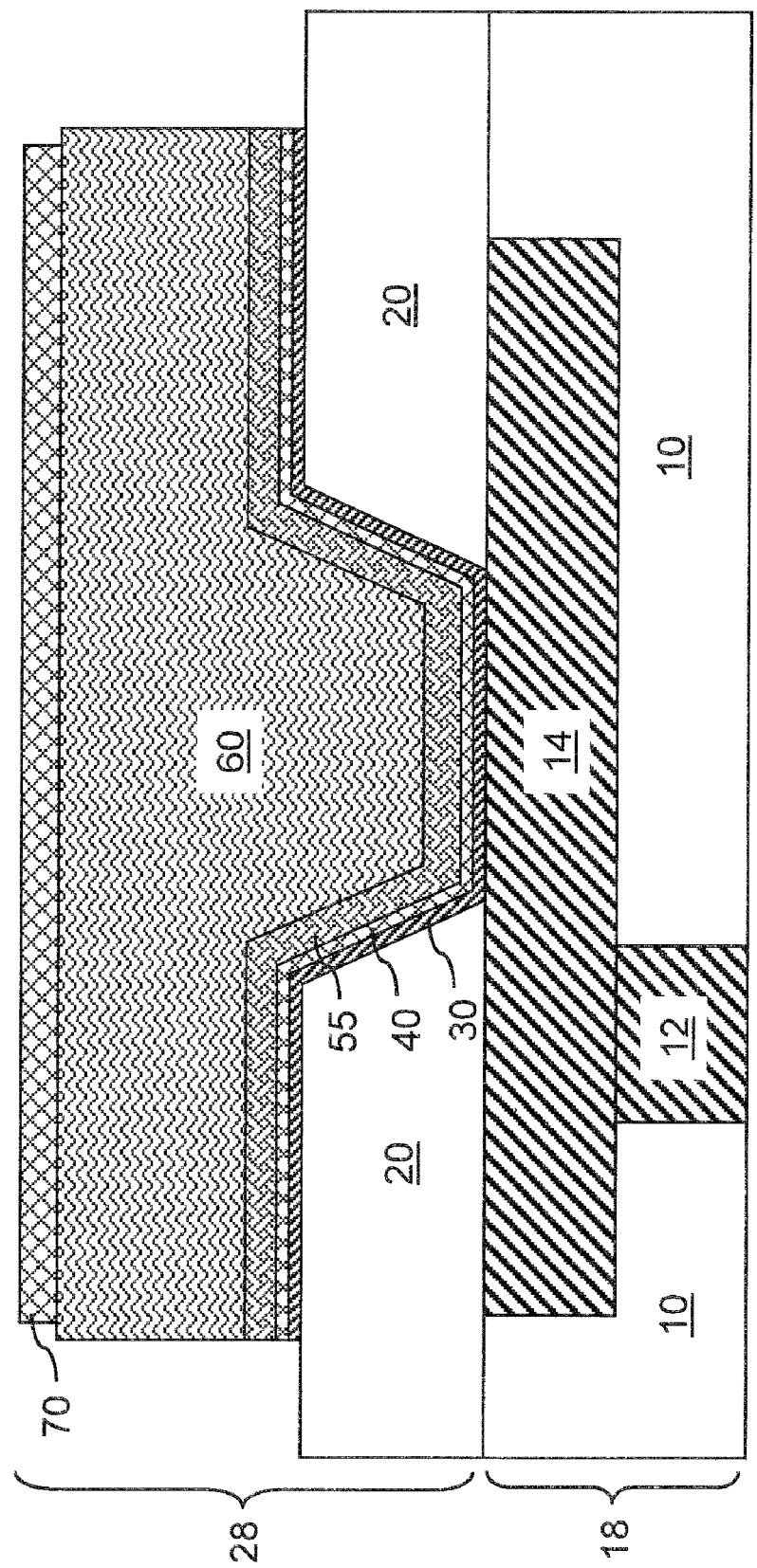

Referring to FIG. 6, the second exemplary metal interconnect structure is annealed in the same manner as in the first embodiment. During the anneal, the Ti liner portion 50 and the lower sub-portion of the aluminum portion 60 react to form a TiAl$_3$ liner portion 55 which comprises the intermetallic compound of TiAl$_3$. The entirety of the Ti material in the Ti liner portion 50 is consumed to form the TiAl$_3$ liner portion 55 as in the first embodiment. The thickness of the TiAl$_3$ liner portion 55 may be from about 10 nm to about 90 nm, and typically from about 15 nm to about 45 nm, although lesser and greater thicknesses are also contemplated herein. The thickness of the aluminum portion 60 may be from about 300 nm to about 3,000 nm, although lesser and greater thicknesses are also contemplated herein.

An overlying dielectric material layer (not shown) may be formed over the at least one vertical stack (30, 40, 55, 60, 70) and patterned as in the first embodiment to form a via opening (not shown) having a tapered sidewall directly above the top surface of the at least one the metal nitride cap portion 70 as in the first embodiment.

Each of the at least one vertical stack (30, 40, 55, 60, 70) constitutes an aluminum-based metal-interconnect structure that may be employed as a wiring structure and pass current. The TiAl$_3$ liner portion 55 enhances electromigration resistance of the aluminum-based metal-interconnect structure in the same manner as in the first embodiment.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a metal interconnect structure comprising:
   forming an elemental metal liner layer directly on a top surface of a dielectric material layer;
   forming a metal nitride liner layer directly on a top surface of said elemental metal liner layer;
   forming a titanium (Ti) liner layer directly on a top surface of said metal nitride liner layer;
   forming an aluminum (Al) layer directly on a top surface of said Ti liner layer;
   forming a metal nitride cap layer directly on a top surface of said aluminum portion;
   patterning said aluminum layer to form an aluminum portion and patterning said Ti liner layer to form a Ti liner portion; and
   annealing said Ti liner portion and said aluminum portion, wherein said Ti liner portion reacts with a sub-portion of said aluminum layer portion to form a TiAl$_3$ liner abutting said metal nitride liner portion and a remaining sub-portion of said aluminum layer portion.

2. The method of claim 1, further comprising forming a conductive structure in said dielectric material layer, wherein a top surface of said conductive structure is substantially coplanar with a top surface of said dielectric material layer.

3. The method of claim 1, further comprising:
   applying a photosensitive material on said metal nitride cap layer;
   lithographically patterning said photosensitive material; and
   transferring a pattern in said photosensitive material into said metal nitride cap layer, said aluminum layer, said Ti liner, said metal nitride liner, and said elemental metal liner, wherein a metal nitride cap portion, said aluminum portion, said Ti liner portion, a metal nitride liner portion, and an elemental metal liner portion are formed.

4. The method of claim 3, wherein said elemental metal liner portion, said metal nitride liner portion, said Ti liner portion, and said aluminum portion have substantially vertically coincident sidewalls after said transfer of said pattern.

5. The method of claim 3, further comprising:
   forming an overlying dielectric material layer which overlies said metal nitride cap; and
   forming an opening in said overlying dielectric material layer, wherein a top surface of said metal nitride cap is exposed in said opening.

6. The method of claim 3, wherein said elemental metal liner consists essentially of Ti or Ta, and wherein said metal nitride liner consists essentially of TiN or TaN, and wherein said metal nitride cap layer consists essentially of TiN or TaN.

7. The method of claim 3, wherein said elemental metal liner layer has a thickness from about 3 nm to about 30 nm, wherein said metal nitride liner layer has a thickness from about 3 nm to about 60 nm, wherein said TiAl$_3$ liner has a thickness from about 10 nm to about 90 nm after said annealing, wherein said aluminum portion has a thickness from about 300 nm to about 3,000 nm, and wherein said metal nitride cap layer has a thickness from about 20 nm to about 200 nm.

* * * * *